United States Patent
Lontz et al.

(10) Patent No.: US 12,389,577 B2
(45) Date of Patent: Aug. 12, 2025

(54) MISSION CONFIGURABLE SHELTER WITH ELECTROMAGNETIC INTERFERENCE (EMI) PROTECTION

(71) Applicant: HDT EXPEDITIONARY SYSTEMS, INC., Solon, OH (US)

(72) Inventors: Travis Lontz, Fredericksburg, VA (US); Charles Deighton, Milford, OH (US); Wade Milek, Mason, OH (US)

(73) Assignee: HDT Expeditionary Systems, Inc., Solon, OH (US)

( * ) Notice: Subject to any disclaimer, the term of this patent is extended or adjusted under 35 U.S.C. 154(b) by 362 days.

(21) Appl. No.: 17/864,618

(22) Filed: Jul. 14, 2022

(65) Prior Publication Data
US 2023/0015863 A1    Jan. 19, 2023

Related U.S. Application Data

(60) Provisional application No. 63/222,204, filed on Jul. 15, 2021.

(51) Int. Cl.
*H05K 9/00* (2006.01)
*E04B 1/343* (2006.01)
(Continued)

(52) U.S. Cl.
CPC ....... *H05K 9/0001* (2013.01); *E04B 1/34336* (2013.01); *E04B 1/34384* (2013.01);
(Continued)

(58) Field of Classification Search
CPC ............... H05K 9/0001; H05K 9/0081; E04B 1/34336; E04B 1/34384; E04B 1/3445;
(Continued)

(56) References Cited

U.S. PATENT DOCUMENTS

| | | |
|---|---|---|
| 3,868,297 A | 2/1975 | Jamison |
| 3,994,105 A | 11/1976 | Jamison et al. |

(Continued)

OTHER PUBLICATIONS

ASTM International, Designation E1925-04, "Specification for Engineering and Design Criteria for Rigid Wall Relocatable Structures", 2004, pp. 1-12.

(Continued)

*Primary Examiner* — Gisele D Ford
(74) *Attorney, Agent, or Firm* — Lippes Mathias LLP

(57) ABSTRACT

A portable shelter with electromagnetic interference (EMI) protection includes a plurality of walls that define an interior space. The walls can be fixed or movable. An EMI protected edge connector joins at least two of the walls together. The EMI protected edge connector assembly can be fixed or hinged. The edge connector can include a metallic outer edge member with two legs and a separate metallic inner edge member with two legs to define an edge channel therebetween with: (i) the first outer leg and the first inner leg are arranged parallel and spaced-apart relative to each other; and (ii) the second outer leg and the second inner leg arranged parallel and spaced-apart relative to each other. The shelter walls can include an inner surface covered by a metallic foil inner layer. A first wall panel is received in a first portion of the edge channel with its metallic foil inner layer contacting the inner edge member and a second wall panel is received in a second portion of the edge channel with it metallic foil inner layer contacting the inner edge member.

10 Claims, 6 Drawing Sheets

(51) Int. Cl.
*E04B 1/344* (2006.01)
*E04B 1/92* (2006.01)
*E04C 2/292* (2006.01)
*E04C 2/52* (2006.01)

(52) U.S. Cl.
CPC .............. *E04B 1/3445* (2013.01); *E04B 1/92* (2013.01); *E04C 2/292* (2013.01); *E04C 2/526* (2013.01); *H05K 9/0081* (2013.01); *E04B 2001/925* (2013.01); *E04B 2103/06* (2013.01)

(58) Field of Classification Search
CPC ...... E04B 1/92; E04B 2001/925; E04C 2/292; E04C 2/526
See application file for complete search history.

(56) References Cited

U.S. PATENT DOCUMENTS

| | | | |
|---|---|---|---|
| 4,726,158 | A | 2/1988 | Fagnoni |
| 4,807,808 | A * | 2/1989 | Reed ..................... A01K 1/033 229/117.02 |
| 5,170,901 | A | 12/1992 | Bersani |
| 5,237,784 | A | 8/1993 | Ros |
| 5,279,436 | A * | 1/1994 | Elliott ................. E04B 1/34321 52/801.1 |
| 5,285,604 | A | 2/1994 | Carlin |
| 5,732,839 | A | 3/1998 | Schimmang |
| 5,761,854 | A | 6/1998 | Johnson |
| 6,085,469 | A | 7/2000 | Wolfe |
| 7,243,464 | B1 | 7/2007 | Crowell |
| 7,334,697 | B2 | 2/2008 | Myers et al. |
| 7,418,802 | B2 | 9/2008 | Sarine |
| 7,823,337 | B2 | 11/2010 | Pope |
| 7,827,738 | B2 | 11/2010 | Abrams |
| 7,874,107 | B1 | 1/2011 | Medley et al. |
| 8,166,715 | B2 | 5/2012 | De Azambuja |
| 8,770,422 | B2 | 7/2014 | Cantin |
| 9,221,599 | B2 | 12/2015 | Brennan, Jr. |
| 9,702,160 | B2 | 7/2017 | Wirtz |
| 2002/0148626 | A1 | 10/2002 | Matsumura et al. |
| 2007/0144078 | A1 | 6/2007 | Frondelius |
| 2007/0170740 | A1 | 7/2007 | Di Franco |
| 2008/0134589 | A1 | 6/2008 | Abrams |
| 2008/0256878 | A1 | 10/2008 | Berns |
| 2009/0217600 | A1 | 9/2009 | De Azambuja |
| 2011/0132421 | A1 | 6/2011 | Dolsby |
| 2012/0240512 | A1 * | 9/2012 | Ting ......................... E04B 1/14 52/745.13 |
| 2015/0030878 | A1 | 1/2015 | Zhi |
| 2016/0265227 | A1 | 9/2016 | Clouse et al. |
| 2017/0051503 | A1 | 2/2017 | Kalinowski |
| 2017/0354064 | A1 | 12/2017 | Milek et al. |
| 2019/0104651 | A1 | 4/2019 | Garagnani et al. |
| 2020/0229328 | A1 | 7/2020 | Deighton et al. |
| 2020/0284024 | A1 * | 9/2020 | Segall ....................... E04B 1/02 |
| 2021/0180317 | A1 | 6/2021 | Shields |

OTHER PUBLICATIONS

Hdtglobal.com, "Mission-Ready, Rigid Wall Shelters for Mobile or Semi-Permanent Operations" (2017) 2 pages.
Hdtglobal.com, "Flat-Pack Rigid Wall Shelters Military-Grade, Fully Integrated, Any Size, Relocatable Shelters" (2017) 2 pages.
http://www.hdtglobal.com/product/emi-shelter/, "EMI Shelter", Sep. 23, 2018, 2 pages.
http://www.gichner.us/fscs.html, "Fixed Site Composite Shelter", Sep. 25, 2019, 1 page.
https://www.aarcorp.com/20-foot-non-expandable-iso-shelter/, "20-Foot Non-Expandable ISO Shelter", Oct. 2, 2019, 3 pages.
https://gdmissionsystems.com/en/services/shelter-systems, "General Dynamics Mission Systems, Shelters", Oct. 2, 2019, 3 pages.
https://www.sbir.gov/print/sbirsearch/detail/333512, "Low Cost Electro Magnetic Interference (EMI) Composite Shelter", Sep. 24, 2019, 2 pages.
https://www.standard.no/en/webshop/productcatalog/productpresent . . . , ASTM E1925:10, "Specification for Engineering and Design Criteria for Rigid Wall Relocatable Structures", Sep. 24, 2019, 1 page.
https://www.sbir.gov/print/sbirsearch/detail/1254591, "Electro-Magnetic Interference Composite Rigid Wall Shelter", Sep. 24, 2019, 4 pages.
http://www.seabox.com/products/category/containerized-shelters, "Containerized Shelters", Aug. 21, 2018, 1 page.
www.dupontbuilding.com, Dupont Building Inc. Flyer, "Fiberglass Shelters", Jan. 2020, 2 pages.

* cited by examiner

MISSION CONFIGURABLE SHELTER WITH ELECTROMAGNETIC INTERFERENCE (EMI) PROTECTION

CROSS-REFERENCE TO RELATED APPLICATION

This application claims priority from and benefit of the filing date of U.S. provisional application Ser. No. 63/222,204 filed Jul. 15, 2021, and the entire disclosure of said provisional application is hereby expressly incorporated by reference into the present specification.

GOVERNMENT SUPPORT/GOVERNMENT LICENSE RIGHTS

This invention was made with government support under Contract No. W56HZV-19-C-0174 awarded by the Department of Defense U.S. Army Contracting Command. The government has certain rights in the invention.

ACKNOWLEDGMENT OF SUPPORT AND DISCLAIMER

This material is based upon work supported by the Army Contracting Command Warren under Contract No W56HZV19C0174. Any opinions, findings and conclusions or recommendations expressed in this material are those of the author(s) and do not necessarily reflect the views of the Government.

BACKGROUND INFORMATION

Portable shelters or containers for transportation to and deployment at a remote site are widely known. These shelters/containers are sometimes referred to as mission configurable shelters and are used by the military and others for establishing field offices, field hospitals, barracks, combat shelters, kitchens, mess halls, command posts, disaster relief shelters, decontamination stations, holding cells, communication centers, laboratories, schools, and the like. Portable shelters can be a fixed size or can include one or more expandable and collapsible wall sections that allow the shelter to be selectively collapsed for storage and transportation of the shelter and that can be selectively expanded for deployment of the shelter.

In certain applications, such portable shelters must provide protection against incoming and outgoing electromagnetic interference (EMI) energy. In the modem era, the use of sensitive electronic systems has become very important for industrial, commercial, and military applications. Electronic systems emit electromagnetic signals, and the electrical equipment is susceptible to interference from such emissions. Thus, EMI is a growing risk and an issue when numerous electronic systems are in close proximity to each other, as their emissions can interfere with each other, causing damage to the systems or improper operation. Furthermore, EMI is produced by electrical systems such as power transmission lines and even cell towers. Because of the widespread use of power lines and various other EMI emitting devices, EMI is a growing problem for electronic equipment.

Cyber security of electronic equipment is also a growing problem due to bad actors intercepting electromagnetic signals from such equipment as a means to obtain information that was intended to be secure and, thus, steal the information or spy on the transmission of such information. In addition, bad actors can generate and transmit EMI with the intent to destroy or damage important electronic equipment and/or jam important signals being transmitted. Thus, a shelter or container which provides proper EMI protection would be very useful for both industrial and military applications.

SUMMARY

In accordance with one aspect of the present development, a portable shelter with electromagnetic interference (EMI) protection includes a plurality of walls that are interconnected to define an interior space. At least one EMI protected edge connector assembly joins two of the walls together and includes a metallic outer edge member with first and second outer legs arranged transversely to define an outer corner and also a metallic inner edge member with first and second inner legs arranged transversely to define an inner corner. The outer and inner edge members are arranged in an aligned, spaced-apart arrangement to define an edge channel therebetween. The outer and inner edge members arranged such that: (i) the first outer leg and the first inner leg are arranged parallel and spaced-apart relative to each other; and (ii) the second outer leg and the second inner leg are arranged parallel and spaced-apart relative to each other. The plurality of walls include first and second wall panels each having an inner surface covered by a metallic foil inner layer. The first wall panel is closely received in a first portion of the edge channel, with the metallic foil inner layer of the first wall panel in contact with and electrically connected to the first inner leg of the inner edge member. The second wall panel is closely received in a second portion of the edge channel that intersects the first portion of the edge channel, wherein the metallic foil inner layer of the second wall panel is in contact with and electrically connected to the second inner leg of the inner edge member.

In accordance with another aspect of the present development, a portable shelter with electromagnetic interference (EMI) protection includes a plurality of wall panels that are interconnected to define an interior space, wherein first and second ones of the wall panels are movable relative to each other between a stowed position and a deployed position. The first and second wall panels each include an inner surface having a metallic foil inner layer located thereon. A hinged EMI protected edge connector assembly movably joins the first and second wall panels together. The hinged EMI edge connector assembly includes a first panel edge connector connected to the first wall panel and in contact with and electrically connected to the metallic foil inner layer of the first wall panel. A second panel edge connector is connected to the second wall panel in contact with and electrically connected to the metallic foil inner layer of the second wall panel. A hinge pivotally connects the first panel edge connector to the second panel edge connector.

DETAILED DESCRIPTION

Figure 1:
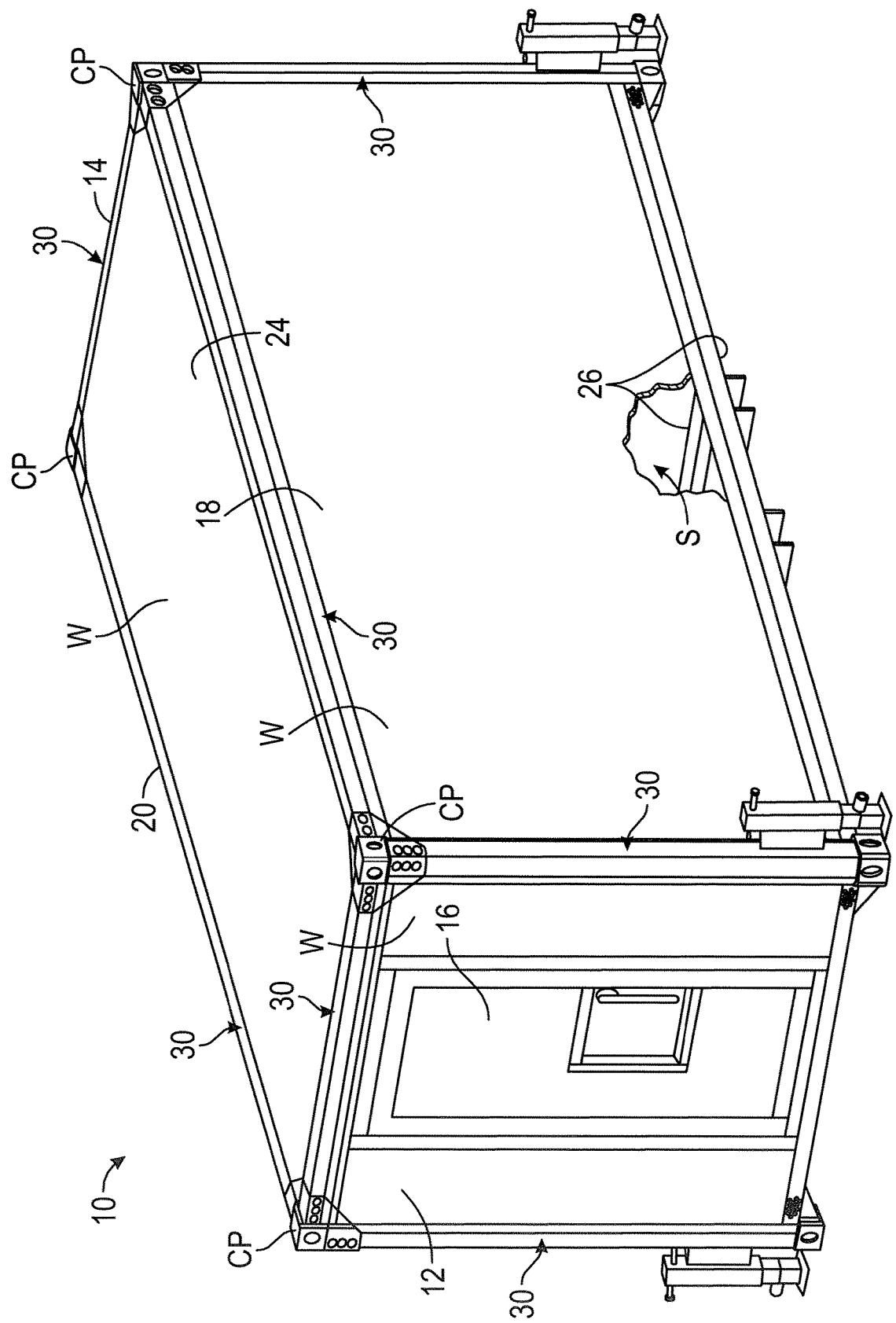
FIG. 1 is an isometric view of a shelter with EMI protection provided in accordance with a first embodiment of the present disclosure.

FIG. 1 illustrates a perspective view of a mission configurable portable container or shelter 10 with electromagnetic interference (EMI) protection according to a first embodiment of the present disclosure. The illustrated example of the shelter 10 is generally a rectangular cube structure that includes opposite parallel, spaced-apart end walls 12,14, first and second parallel spaced-apart side walls 18 and 20, as well as parallel spaced-apart top and bottom walls 24,26. A portion of the wall 18 is broken away to reveal the interior envelope or space S defined by and between the walls 12,14,18,20,24,26. An EMI protected door 16 may be located in one or both of the first and second end walls 12,14 or in another wall 18,20,24,26. If desired, the shelter 10 may also include one or more EMI protected windows disposed in any one or more of the walls 12,14,18,20,24,26. EMI protection for such windows can be achieved by, for example, employing a ballistic glass, i.e., an acrylic material which absorbs EMI. Each wall 12,14,18,20,24,26 of the shelter 10 is sometimes generally referred to herein as a wall W. The walls W are joined where they intersect along their edges by an EMI protected edge connector assembly 30, provided in accordance with an embodiment of the present disclosure, which maintains the integrity of the EMI protected envelope or space S (see also FIG. 4) defined between the walls W of the shelter 10.

Figure 2:
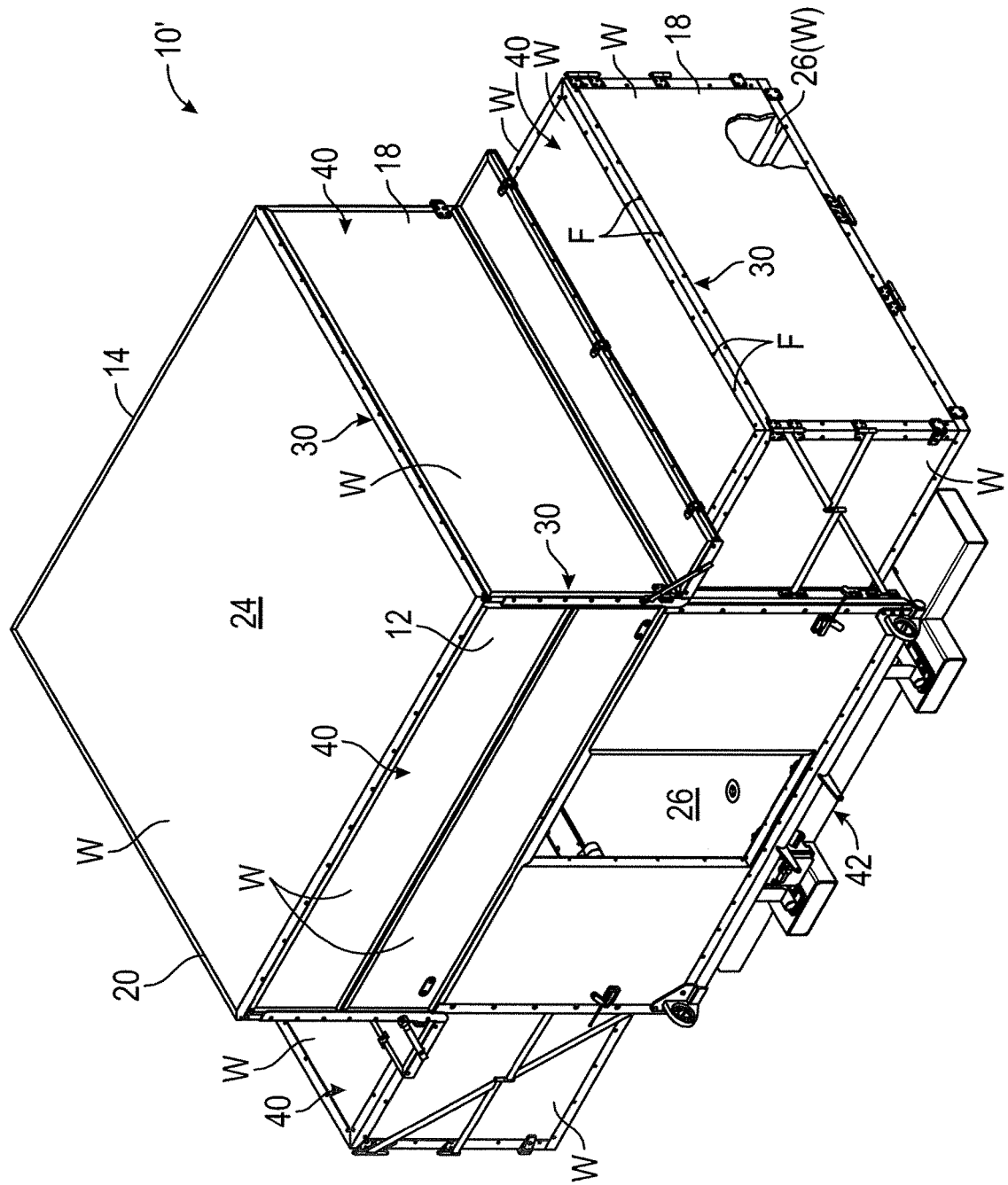
FIG. 2 is an isometric view of a shelter with EMI protection provided in accordance with a second embodiment of the present disclosure.

FIG. 2 shows another embodiment of a mission configurable portable shelter 10' with EMI protection according a second embodiment of the present disclosure. Unlike the shelter 10 of FIG. 1, the portable shelter 10' includes one or more movable or expandable wall sections 40 that are selectively deployed relative to a primary shelter base structure 42 by sliding, pivoting, relocation, and/or other movement to expand the size of the shelter 10'. The movable wall sections 40 can be selectively stowed relative to the primary shelter base structure 42 by sliding, pivoting, relocation, and/or other movement in directions opposite their respective deployment directions to reduce the size of the shelter 10' for storage and/or transport. Similar to the shelter 10, the movable wall sections 40 and base 42 of the shelter 10' each include at least some of the end walls 12,14 side walls 18,20 and top and bottom walls 24,26 as described above in relation to the shelter 10. These various walls 12,14,18,20, 24,26 of the shelter 10' are each sometimes generally referred to as a wall W and they can be joined together where they meet or abut by an EMI protected edge connector assembly 30 provided in accordance with an embodiment of the present disclosure. The walls W define an interior envelope or space S as described above in relation to the shelter 10 (a portion of the wall 18 is broken away to show the internal space S.

Figure 3:
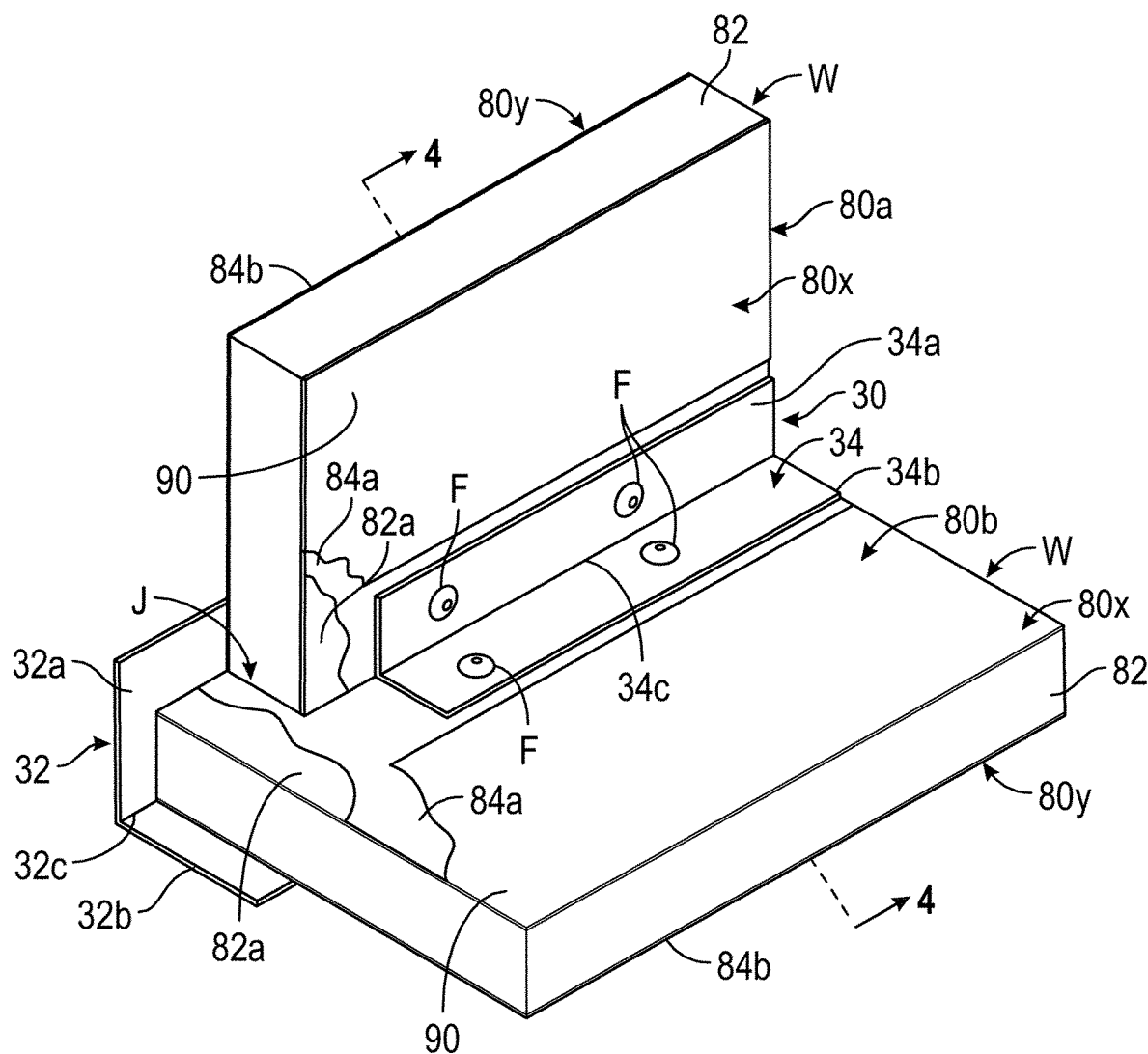
FIG. 3 is an isometric view of an EMI protected edge connector assembly provided in accordance with a first embodiment of the present disclosure.
Figure 4:
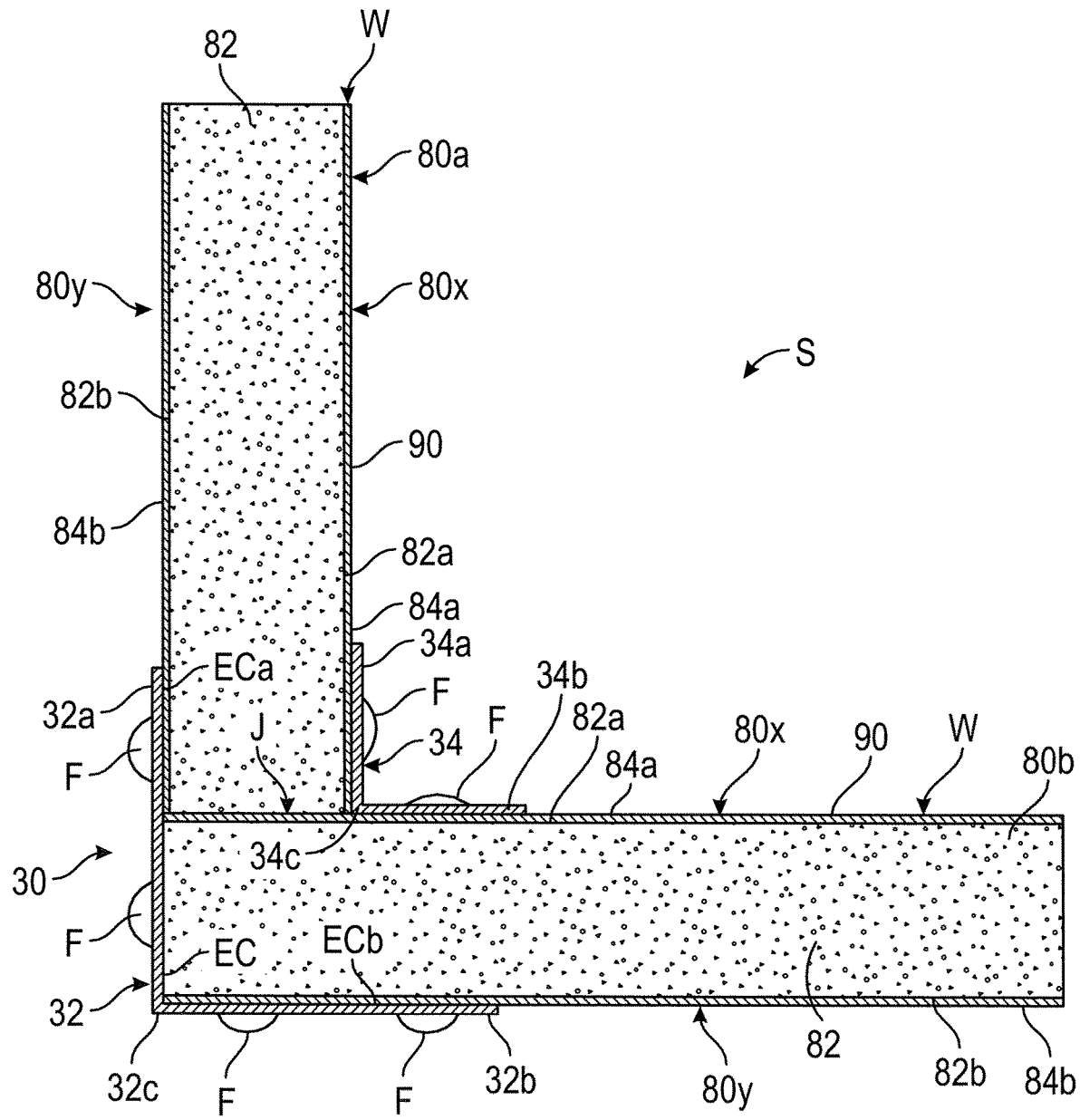
FIG. 4 is a section view as taken at 4-4 of FIG. 3.

With reference now to FIGS. 3 & 4, the walls W of the shelter 10,10' can each be made of a layered or sandwich-type composite material wall panel 80. In one embodiment, the wall panel 80 comprises a core 82 such as a fiberglass composite panel core but other materials can be used. Adhered to at least an inner surface 82*a* of the panel core 82 is an inner layer 84*a* of metallic foil oriented toward the internal or enclosed space of the shelter 10,10' defined between the walls W. In the illustrated embodiment, the opposite outer surface 82*b* of the panel core 82 includes an outer layer 84*b* of metallic foil that is oriented toward the exterior of the shelter 10,10' outside of the walls W. Each foil layer 84 (84*a*,84*b*) is preferably co-extensive with the surface 82*a*,82*b* of the panel core 82 to which it is applied. In one embodiment, the metal foil layers 84*a*,84*b* (generally 84) can be a thin layer or film made of a metallic foil material such as aluminum foil on the order of 0.010 inches (0.254 mm) in thickness. The thickness of the metal foil layer 84 can, in one embodiment, range between 0.005 inches and 0.020 inches (0.127 mm to 0.508 mm). The metal foil layer 84 may be adhered to the core 82 by a spray-on adhesive, a film adhesive, a roll-on adhesive, or any other suitable adhesive applied to at least one of the surfaces meant to be adhered and/or the foil layer 84 can be mechanically connected to the panel 82 by fasteners, clips, a frame, or the like. The metal foil material can comprise aluminum, steel, copper, stainless steel, or any other suitable metal foil that prevents transmission of EMI therethrough and that can conduct EMI energy currents to a ground path for dissipation/attenuation. While the foil layer 84 is relatively thin, it can be patched as necessary if someone inadvertently punctures or tears the foil layer 84. Because the foil layer 84 is thin, it can better conform to the surface(s) 82*a*,82*b* to which it is adhered/connected, as compared to relatively thicker metal layers, and its thin structure reduces weight. As noted, in the illustrated embodiment, at least the inner foil layer 84*a* is provided on each panel 80, and both the inner and outer foil layers 84*a*,84*b* can be provided. In an alternatively embodiment, only the outer foil layer 84*b* is provided on each panel 80.

If desired, at least part of the inner and/or outer layer 84*a*,84*b* of foil 84 of at least one panel 80 can be covered on its exposed face with a protective layer or coating 90 of a durable, wear-resistant, water-proof material for protection from damage caused by equipment, foot traffic, cleaning liquids, and environmental contaminants. As described below, the protective covering layer 90 is omitted where the foil 84 must make a physical connection with the EMI protected edge connector 30 for electrical conduction between the foil 84 and the edge connector 30. In the illustrated embodiment, at least some of the wall panels 80 comprise a protective layer 90 comprising a gelcoat layer which can be, e.g., an epoxy or unsaturated polyester resin thermoset polymer coating or similar gelcoat layer that forms a hard durable surface that resists wear, protects the foil layer 84, and is non-permeable to water to allow for washing. The protective layer 90 can include a textured surface 92 to provide non-skid characteristics and can be tinted or coated with a desired color.

In other embodiments, the core member 82 of the wall panel 80 may be made of other types of suitable materials, including one or more layers of different materials. These materials can include, e.g., fiber reinforced materials (carbon, aluminum or aramid fiber reinforced plastic materials), as well as thermally insulative materials such as rigid foam, or other materials such as corrugated non-metallic materials, wood, metal, and others. What is desirable for such wall panels is that they have a high strength-to-weight ratio, provide corrosion resistance, have a high stiffness-to-weight ratio, are chemically inert, have a high durability potential and good rigidity. Regardless of their exact construction, the panels 80 each have an inner side or surface 80*x* oriented inwardly toward the interior enclosed space of the shelter 10,10' and an opposite outer side or surface 80*y* oriented outwardly away from the shelter 10,10'.

With continuing reference to FIGS. 3 & 4, the EMI protected edge connector assembly 30 is shown as used to connect first and second wall panels 80 (80a,80b) together in an EMI-protected arrangement. The edge connector assembly 30 extends at least substantially coextensively along a joint J formed between the two abutted panels 80a,80b but can be omitted where the joint J is otherwise protected such as by a metallic corner piece CP as shown in FIG. 1. The edge connector assembly 30 comprises a first or outer edge member 32 and a second or inner edge member 34. The outer and inner edge members 32,34 preferably each comprise a one-piece metallic member having an L-shaped profile defined from aluminum, steel or stainless steel or another electrically conductive metal. The outer edge member 32 includes first and second outer legs 32a,32b, and the inner edge member 34 includes first and second inner legs 34a,34b. The first and second outer legs 32a,32b of the outer edge member 32 and the first and second inner legs 34a,34b of the inner edge member are respectively arranged transversely relative to each other such as perpendicularly at a 90-degree angle to form respective outer and inner corners 32c,34c that are right-angled in the illustrated embodiment. For each edge member 32,34, the respective legs 32a,32b or 34a,34b thereof can be the same length or different lengths relative to each other, but assembly can be simplified if there are the same length relative to each other such that the edge member 32,34 can be installed in either first or second orientations without any consequence, i.e., the first and second legs can be interchangeable if the same length.

The outer and inner edge members 32,34 are arranged in an aligned, spaced-apart arrangement with the respective first legs 32a,34a being arranged parallel and spaced-apart relative to each other and with the respective second legs 32b,34b being arranged parallel and spaced-apart relative to each other such that an L-shaped edge channel EC is defined between the outer and inner edge members 32,34. The edge channel includes interconnected first and second portions ECa,ECb (FIG. 4) defined respectively between the respective first legs 32a,34a (for the first portion ECa) and between the respective second legs 32b,34b (for the second portion ECb). The respective corners 32c,34c can be aligned on a common reference plane that bisects or otherwise divides both 90-degree angles defined respectively by the legs 32a,32b and legs 34a,34b.

The abutted walls panels 80a,80b are perpendicularly oriented relative to each other. A first wall panel 80a is closely received in a first portion EC1 of the edge channel EC with its inner foil layer 84a abutted and electrically connected with the inner edge member 34 such that an EMI electrical currents present in the inner foil layer 84a are conducted from the inner foil layer 84a, into and through the inner edge member 34 to a ground path. Similarly, the second wall panel 80b is closely received in a second portion EC2 of the edge channel EC that perpendicularly connects with the first channel portion EC1 with the inner foil layer 84a of the panel 80b abutted and electrically connected with the inner edge member 34 such that an EMI electrical currents present in the inner foil layer 84a are conducted from the inner foil layer 84a, into and through the inner edge member 34 to a ground path. The perpendicularly oriented wall panels 80a,80b are preferably abutted in a butt joint arrangement as shown with a transverse end or butt of one panel 80a,80b abutted with the inner surface 80x of the other panel such that the edge channel is filled by the two panels 80a,80b with no air gaps. The inner edge member 34 bridges the EMI currents from the inner foil layer 84a of one panel 80a,80b to the inner foil layer 84a of the other 80a,80b for conduction to a ground path electrically connected to one of the inner edge members 34 or elsewhere. If the panels 80a,80b include an outer foil layer 84b (as shown in the illustrated embodiment), the respective outer foil layers 84b thereof are abutted with and electrically connected to the outer edge member 32. The outer edge member 32 bridges the EMI currents from the outer foil layer 84b of one panel 80a,80b to the outer foil layer 84b of the other panel 80a,80b for conduction to a ground path electrically connected to one of the outer edge members 32 or elsewhere.

The outer and inner edge members 32,34 can each be connected to the panels 80 using fasteners F such as rivets, screws, bolts, clips, and/or any other suitable fasteners that engage the outer and/or inner edge member 32,34 and the panel 80 such that a first plurality of fasteners F engage and connect the outer edge member 32 and the panel 80 and a second plurality of fasteners F engage and connect the inner edge member 34 and the panel 80. Adhesive may be applied at the joint J where the panels 80 are abutted provided that the adhesive is applied in a manner that does not prevent electrical conductivity between the inner foil layers 84a and the inner edge member 34 or between the outer foil layers 84b and the outer edge member 32. As noted above, if a gelcoat or other protective covering layer 90 is provided on the inner foil layer 84a, the coating 90 omitted from at least the part of the panel 80 located in the edge channel EC to ensure a good electrically conductive connection between the foil layer 84a and the inner edge member 34. Likewise, if the outer foil layer 84b is provided and includes a gelcoat or other protective covering layer 90, the coating 90 is omitted from at least the part of the panel 80 located in the edge channel EC to ensure a good electrically conductive connection between the foil layer 84b and the outer edge member 32.

The disclosed edge connector assembly 30, in which the outer and inner edge members 32,34 are separate pieces that can be moved toward and away from each other during assembly to alter the width of the edge channel EC defined therebetween, ensures that when the first and second walls panels 80 are operably connected together as shown in FIGS. 3 & 4, the edge connector members 32,34 are respectively firmly abutted with the outer and inner sides 80y,80x of the panels 80 and electrically connected to the foil layer 84a (and the optional outer file layer 84b if present) such that the panels 80 are tightly gripped between the edge members 32,34 and immovably held in such position by the fasteners F. This structure for the edge connector assembly 30 in which the outer and inner edge members 32,34 are separate can be advantageous as compared to an edge connector assembly in which the edge channel EC is a fixed width that can lead to undesired gaps being defined between the foil layers 84a,84b and the edge connector assembly due to tolerances which can interfere with electrical conductivity.

Figure 5:
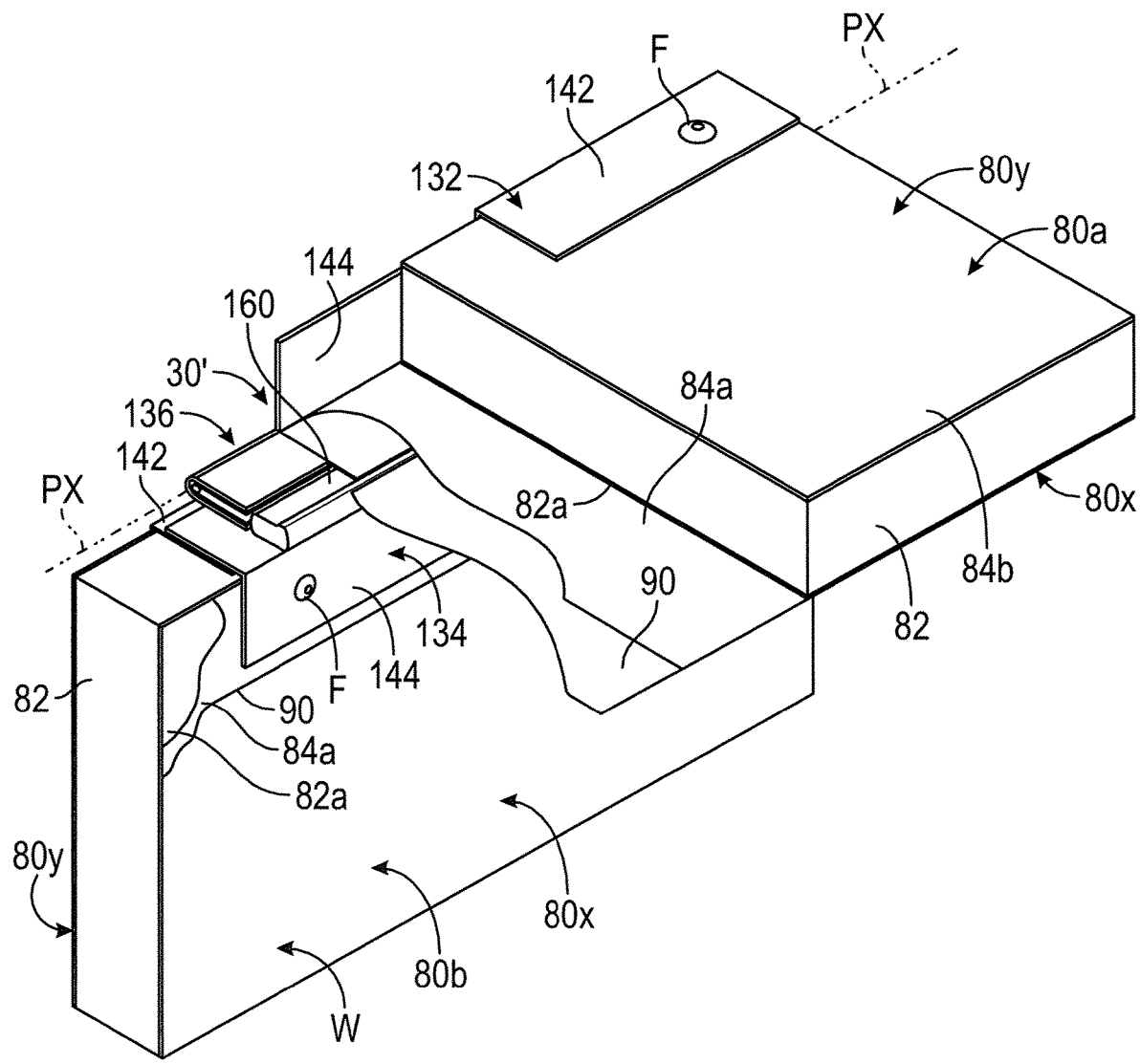
FIG. 5 is an isometric view of an EMI protected edge connector assembly provided in accordance with a second embodiment of the present disclosure.
Figure 6:
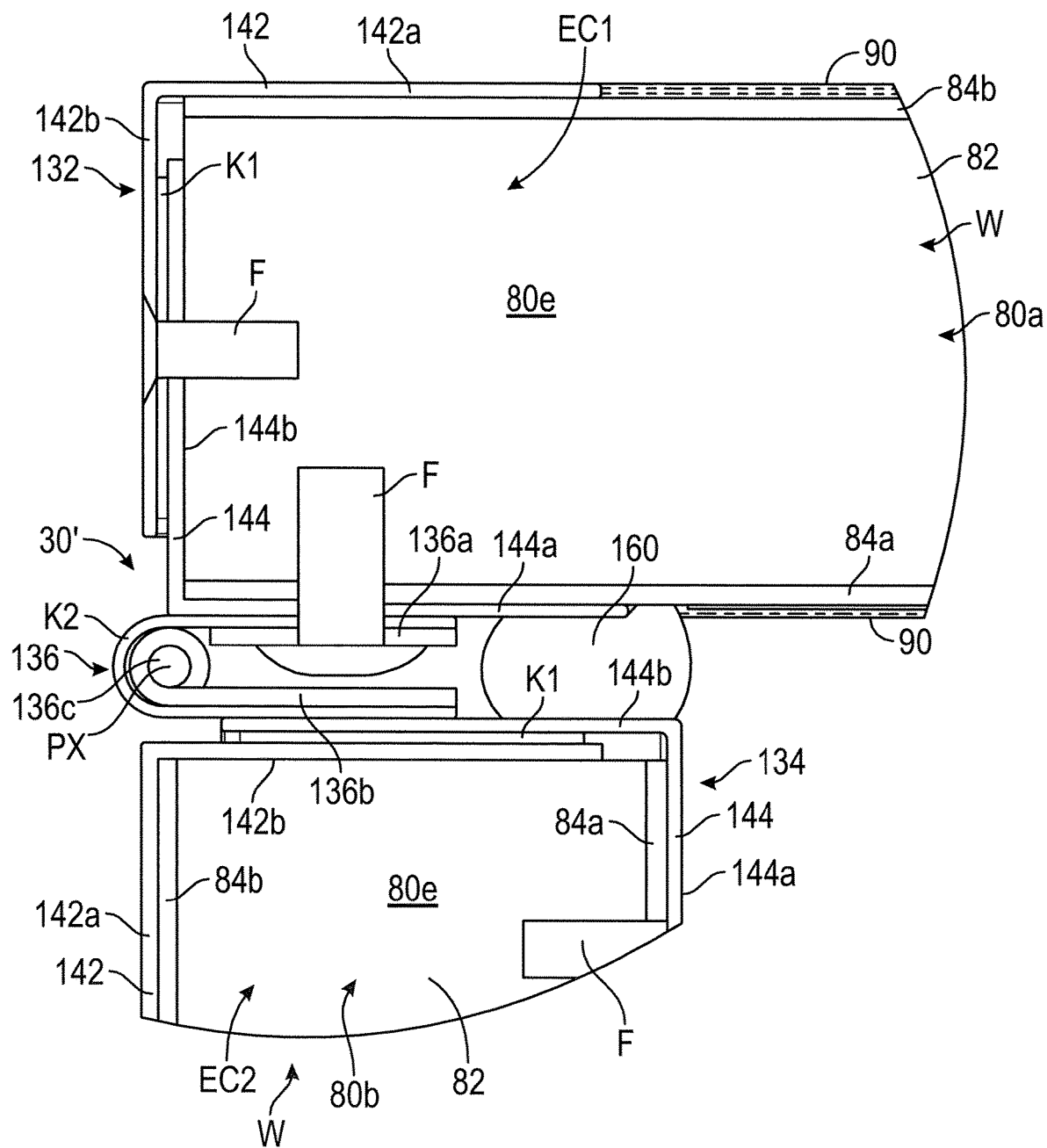
FIG. 6 is a section view of the EMI protected edge connector assembly of FIG. 5.

As noted above, in some embodiments, an EMI protected shelter 10,10' provided in accordance with the present disclosure can include wall panels 80 that move relative to each other to deploy or stow the shelter 10,10'. In one such embodiment as shown in FIGS. 5 & 6, first and second wall panels 80a,80b are pivotally connected together and pivot relative to each other about a pivot axis PX. This arrangement can be provided in an EMI protected manner using a hinged EMI protected edge connector assembly 30'. The hinged connector assembly 30' comprises a first panel edge connector 132 connected to a first wall panel 80a, a second panel edge connector 134 connected to a second wall panel 80b, and a hinge 136 that pivotally connects the first panel edge connector 132 to the second panel edge connector 134 for pivoting or rotational movement of the panel edge connectors 132,134 and wall panels 80a,80b relative to each other about the pivot axis PX.

The hinge 136 can comprise, for example, a first hinge portion or leaf 136a connected to the first panel edge connector 132, a second hinge portion or leaf 136b connected to the second panel edge connector 134, and a pivot pin 136c that is installed through a plurality of aligned apertures of the first and second hinge portions/leaves 136a, 136b to pivotally interconnect the first and second hinge portions 136a,136b for pivoting movement about the pivot axis PX defined by the pivot pin 136c.

The first panel edge connector 132 comprises a first open U-shaped channel EC1 in which a butt edge 80e of the first panel 80a is located and retained. Likewise, the second panel edge connector 134 comprises a second open U-shaped channel EC2 in which a butt edge 80e of the second panel 80b is located and retained. More particularly, the first and second panel edge connectors 132,143 each comprise outer (first) an inner (second) panel edge members 142,144 that are separate interconnected to define the respective U-shaped channels EC1,EC2 that are adapted to receive a respective edge of the wall panels 80a,80b. In the illustrated embodiment, the outer and inner edge members 142,144 preferably each comprise a one-piece metal member or bracket with an L-shaped profile defined from aluminum, steel or stainless steel or another electrically conductive metal including first and second legs 142a,142b (for the outer edge member 142) and 144a,144b (for the inner edge member 144) arranged at a 90-degree angle. For each edge member 142,144, the respective legs 142a,142b or 144a,144b thereof can be the same length or different lengths relative to each other, but assembly can be simplified if there are the same length relative to each other such that the edge member 142,144 can be installed in either first or second orientations without any consequence.

For each panel edge connector 132,134, the outer and inner edge members 142,144 thereof are arranged in an opposed facing arrangement with their respective second legs 142b,144b overlapped and their respective first legs 142a,144a arranged in a parallel spaced-apart facing relationship to define the respective channels EC1,EC2 and receive an edge 80e of a respective panel 80a,80b therebetween. For each panel edge connector 132,134, the first leg 142a of the outer edge member 142 is in contact with and electrically connected to the outer foil layer 84b (if provided) of the panel 80 and the first leg 144a of the inner edge member 144 is in contact with and electrically connected to the inner foil layer 84a of the panel 80.

During assembly, the outer and inner edge members 142,144 can be moved toward each other and firmly abutted with the panel 80a,80b to ensure firm contact and a good electrical connection between the edge members 142,144 and the foil layer(s) 84b,84a. The outer and inner edge members 142,144 can be fixedly secured to the panel 80 by a plurality of rivets, screws, or other fasteners F that extend through their respective first legs 142a,144a and second legs 142b,144b and into the panel 80. Some of the fasteners F also extend through and are used to secure the first and second hinge portions 136a,136b to the respective panels 80a,80b (as shown only for the first hinge portion 136a in FIG. 6 to simplify the drawing).

With particular reference to FIG. 6, in some embodiments, a thermal gasket K1 such as a rubber membrane or similar thermally non-conductive gasket is installed between the respective second legs 142b,144b of the outer and inner edge members 142,144 to provide a thermal break that interrupts a thermal pathway between the inner and outer edge members 142,144. Similarly, a hinge protection gasket K2 can surround the hinge 136 and cover or wrap the first and second hinge portions 136a,136b to prevent light, air, sand, and contaminants from passing through gaps in the hinge 136. Because such a hinge protection gasket K2 can interrupt electrical continuity between the first and second panel edge connectors 132,134 through the hinge 136, the hinged panel connector assembly 30' further comprises an electrical bridge or bridge member 160 such an EMI metal mesh gasket that is adhesively and/or mechanically secured via fasteners or the like (and also electrically connected) to one of the first and second panel edge connectors 132,134 (such as the first panel edge connector 132 in the illustrated embodiment) and that contacts and electrically connects with the other of the first and second panel edge connectors 132,134 (the second panel edge connector 134 in the illustrated embodiment) when the first and second panels 80a, 80b are arranged in their deployed operative positions to provide electrical continuity and an electrical pathway between the first and second panel edge connectors 132,143 across the hinge 136. In the illustrated example, the mesh metal gasket or other electrical bridge member 160 is adhesively and/or mechanically secured via fasteners or the like (and also electrically connected) to the inner edge member 144 of one of the first and second panel edge connectors 132,134 (such as the first panel edge connector 132 in the illustrated embodiment) and contacts and electrically connects with the inner edge member 144 of the other of the first and second panel edge connectors 132,134 (the second panel edge connector 134 in the illustrated embodiment) when the first and second panels 80a,80b are arranged in their deployed operative positions (such as the illustrated 90-degree arrangement of the panels 80a,80b as shown in FIG. 6) to provide an electrical pathway or bridge for EMI currents to bypass the hinge 136 and flow directly between the first and second panel edge connectors 132,134 and between at least the inner foil layers 84a respectively engaged with the edge connectors 132,134 through the mesh gasket 160 or other electrical bridge member 160 such that such EMI currents can be conducted to a ground path for dissipation. In this manner, the electrical bridge member 160 electrically connects and provides electrical continuity between the first and second panel edge connectors 132,134 at least when the first and second panels 80a,80b are arranged in the deployed position relative to each other.

EMI metal mesh gaskets 160 are available in various cross sections to accommodate many different attenuation and mounting requirements encountered in EMI shielding applications. Thus, for example, the gaskets 160 can be rectangular, round, oval, round with a fin or double round in order to ensure that enclosures or other equipment will be RF sealed appropriately. In one embodiment, the gaskets 160 can be made of a knitted wire mesh with the material of the gaskets being made of, for example, a nickel-copper alloy, such as Monel, a ferrous alloy, such as a tin-steel combination or a beryllium copper alloy. Various materials for the mesh gasket are more or less effective in shielding. For example, attenuation levels up to 60 dB or perhaps even up to 120 dB at some frequencies are possible with wire mesh gaskets.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. A portable shelter with electromagnetic interference (EMI) protection, said shelter comprising:
    a plurality of walls that are interconnected to define an interior space;
    at least one EMI protected edge connector assembly that joins two of said walls together, said at least one EMI edge connector assembly comprising:
    a metallic outer edge member comprising first and second outer legs arranged transversely to define an outer corner;
    a metallic inner edge member comprising first and second inner legs arranged transversely to define an inner corner;
    said outer and inner edge members arranged in an aligned, spaced-apart arrangement to define an edge channel therebetween, said outer and inner edge members arranged such that: (i) the first outer leg and the first inner leg are arranged parallel and spaced-apart relative to each other; and (ii) the second outer leg and the second inner leg are arranged parallel and spaced-apart relative to each other;
    wherein said plurality of walls comprise first and second wall panels each comprising an inner surface covered by a metallic foil inner layer;
    said first wall panel closely received in a first portion of said edge channel, wherein said metallic foil inner layer of said first wall panel is in contact with and electrically connected to said first inner leg of said inner edge member;
    said second wall panel closely received in a second portion of said edge channel that intersects said first portion of said edge channel, wherein said metallic foil inner layer of said second wall panel is in contact with and electrically connected to said second inner leg of said inner edge member;
    wherein said metallic inner edge member of said at least one EMI protected edge connector assembly electrically connects the metallic foil inner layer of one of the first and second wall panels to the metallic foil inner layer of the other of the first and second wall panels and conducts EMI currents present in the metallic foil inner layer of said one of the first and second wall panels to the metallic foil inner layer of the other of the first and second wall panels for conduction of said EMI currents to a ground path electrically connected to said inner edge member.

2. The portable shelter as set forth in claim 1, wherein said outer and inner edge members are L-shaped in profile and wherein said edge channel defined between said outer and inner edge members is L-shaped.

3. The portable shelter as set forth in claim 1, wherein said outer edge member and said inner edge member are separate structures that are arranged relative to each other to tightly grip said first and second wall panels therebetween.

4. The portable shelter as set forth in claim 3, wherein said outer edge member is connected to the first and second panels by a first plurality of fasteners, and wherein said inner edge member is connected to the first and second panels by a second plurality of fasteners.

5. The portable shelter as set forth in claim 3, wherein said metallic foil inner layer of both said first wall panel and said second wall panel comprises a thickness in the range of 0.005 inches to 0.020 inches.

6. The portable shelter as set forth in claim 5, wherein said metallic foil inner layer of both said first and second wall panels comprises aluminum foil.

7. The portable shelter as set forth in claim 6, wherein said first and second panels each further comprise an outer surface covered by a metallic foil outer layer.

8. The portable shelter as set forth in claim 7, wherein said metallic foil outer layer comprises aluminum foil having a thickness in the range of 0.005 inches to 0.020 inches.

9. The portable shelter as set forth in claim 6, wherein each of said first and second wall panels each comprises a fiberglass composite core.

10. The portable shelter as set forth in claim 9, wherein at least part of said metallic foil inner layer of at least one of said first and second panels comprises a gelcoat protective covering.

* * * * *